United States Patent
McNulty et al.

(10) Patent No.: US 6,903,505 B2
(45) Date of Patent: Jun. 7, 2005

(54) LIGHT-EMITTING DEVICE WITH ORGANIC ELECTROLUMINESCENT MATERIAL AND PHOTOLUMINESCENT MATERIALS

(75) Inventors: Thomas Francis McNulty, Ballston Lake, NY (US); Anil Raj Duggal, Niskayuna, NY (US); Larry Gene Turner, Schenectady, NY (US); Joseph John Shiang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 57 days.

(21) Appl. No.: 09/683,345

(22) Filed: Dec. 17, 2001

(65) Prior Publication Data

US 2003/0111955 A1 Jun. 19, 2003

(51) Int. Cl.⁷ .................................................. H01J 1/62
(52) U.S. Cl. ........................ 313/504; 313/503; 313/506
(58) Field of Search ................................ 313/504, 503, 313/502, 509, 506, 110, 111; 427/66; 428/670, 917

(56) References Cited

U.S. PATENT DOCUMENTS

| | | |
|---|---|---|
| 4,230,858 A | 10/1980 | Gall et al. |
| 4,446,324 A | 5/1984 | Graser |
| 4,540,763 A | 9/1985 | Kirchhoff |
| 4,618,694 A | 10/1986 | Iden et al. |
| 4,769,292 A | 9/1988 | Tang et al. |
| 5,185,391 A | 2/1993 | Stokich, Jr. |
| 5,294,870 A | 3/1994 | Tang et al. |
| 5,470,502 A | 11/1995 | Hahn et al. |
| 5,683,823 A * | 11/1997 | Shi et al. ..................... 428/690 |
| 5,686,360 A | 11/1997 | Harvey, III et al. |
| 5,717,289 A * | 2/1998 | Tanaka ........................ 313/503 |
| 5,757,126 A | 5/1998 | Harvey, III et al. |
| 5,998,803 A | 12/1999 | Forrest et al. |
| 6,023,371 A * | 2/2000 | Onitsuka et al. ............. 359/620 |
| 6,515,314 B1 * | 2/2003 | Duggal et al. ................ 257/184 |

OTHER PUBLICATIONS

J. Kjido et al., "Multilayer White Light–Emitting Organic Electroluminescent Device," 267 Science 1332–1334 (1995).
R.A. Meyers (Ed.), "Encyclopedia of Physical Science and Technology," vol. 7, 230–231 (1987).
H. Suzuki et al., "Near–Ultraviolet Electroluminescence From Polysilanes," 331 Thin Solid Films 64–70 (1998).
J. Kido et al., "White Light–Emitting Organic Electroluminescent Devices Using the Poly (N–Vinylcarbazole) Emitter Layer Doped with Three Fluorescent Dyes," Appl. Phys. Lett., vol. 64, No. 7.
J. Kido et al., "Single–Layer White Light–Emitting Organic Electroluminescent Devices Based on Dye–Dispersed Poly (N–Vinylcarbazole)," Appl. Phys. Lett., vol. 67, No. 16, 2281–2283 (1995).
U.S. Appl. No. 09/592,045.
U.S. Appl. No. 09/713,394.

* cited by examiner

*Primary Examiner*—Gary Paumen
*Assistant Examiner*—Edwin A. Leon
(74) *Attorney, Agent, or Firm*—Jason K. Klindtworth; Jean K. Testa (57) ABSTRACT

A light-emitting device comprises a light-emitting member, which comprises two electrodes and an organic electroluminescent material disposed between the electrodes, and at least one organic photoluminescent ("PL") material. The light-emitting member emits light having a first spectrum in response to a voltage applied across the two electrodes. The organic PL material absorbs a portion of the light emitted by the light-emitting member and emits light having second spectrum different than the first spectrum. The light-emitting device can include an inorganic PL material that absorbs another portion of the light emitted from the light-emitting member and emits light having a third spectrum different than both the first and the second spectra.

42 Claims, 8 Drawing Sheets

LIGHT-EMITTING DEVICE WITH ORGANIC ELECTROLUMINESCENT MATERIAL AND PHOTOLUMINESCENT MATERIALS

STATEMENT REGARDING FEDERALLY SPONSORED RESEARCH OR DEVELOPMENT

This invention was first conceived or reduced to practice in the performance of work under contract DE-FC26-00NT40989 awarded by the United States Department of Energy. The United States of America may have certain rights to this invention.

BACKGROUND OF INVENTION

The present invention relates generally to light-emitting devices having organic electroluminescent material and, more particularly, to light-emitting devices wherein light emitted from an organic electroluminescent layer is modified by organic and/or inorganic photoluminescent materials.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent semiconductor layers are sandwiched between a cathode and an anode. The semiconductor layers may be either hole (positive charge)-injecting or electron (negative charge)-injecting layers and also comprise organic materials. The material for the light-emitting layer may be selected from many organic EL materials. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometer. To achieve a white light, prior-art devices incorporate closely arranged OELDs emitting blue, green, and red light. These colors are mixed to produce white light. An alternate scheme to produce white light is set forth in U.S. Pat. No. 5,294,870 which describes an organic EL multicolor display device comprising an organic EL source emitting blue light with green- and red-emitting fluorescent materials applied to different subpixel areas. This device emits different colors from the different subpixel areas by color shifting with the green- and red-emitting fluorescent materials. However, the manufacture of such microdevices is complex and requires sophisticated technologies.

Another example of an OELD is described in Junji Kido et al., "Multilayer White Light-Emitting Organic Electroluminescent Device," 267 Science 1332–1334 (1995). This device includes three emitter layers with different carrier (or charge) transport properties, each emitting blue, green, or red light, which layers are used together to generate white light. However, the formation of successive layers requires a high degree of care so that the interfaces between the layers do not introduce unnecessary barriers to charge transport. In this device, the layers emitting the different colors typically degrade over time at different rates. Consequently, the color of light emitted from the device is likely to change over time. In addition, the uniformity of the light output over the emitting area of the device may be less than desirable because of imperfections at the interfaces between the layers.

Therefore, it is desirable to provide a light source based on organic EL materials that emit light at controllable wavelengths that have improved efficiency and that is simple to manufacture. It is also desirable to use such light sources to produce white light.

SUMMARY OF INVENTION

A light-emitting device of the present invention comprises: (1) a light-emitting member that comprises two electrodes and at least one organic EL material that is disposed between the electrodes; and (2) at least one organic photoluminescent ("PL") material optically coupled with the light-emitting member. The light-emitting member is disposed on a substrate. The organic EL material emits EM radiation having a first spectrum when an electrical voltage is applied across the anode and the cathode. The organic PL material absorbs at least a first portion of the EM radiation emitted from the organic EL material having the first spectrum and emits EM radiation having a second spectrum. In one aspect of the present invention, the light-emitting device further comprises an inorganic material disposed adjacent to the at least one organic EL material and the organic PL material. In one aspect of the present invention, the inorganic material can be a PL material that can absorb at least a second portion of the EM radiation emitted from the organic EL material and emits EM radiation having a third spectrum. In another aspect of the present invention the inorganic material may be a light-scattering material. The EM radiation having the first spectrum that is not absorbed by the organic PL material and the inorganic PL material is mixed with the EM radiation having the second and third spectra to produce light having a desired color.

According to one aspect of the present invention, the organic and inorganic PL materials are dispersed separately in layers of polymeric materials.

According to another aspect of the present invention, particles having nanometer size ("nanoparticles") or micrometer size ("microparticles") of a scattering material is disposed in a path of light emitted by at least one of organic EL material, organic PL material, and inorganic PL material to provide an increased degree of control over the total amount of light scattering.

The present invention also provides a method for producing a light-emitting device based on at least one organic EL material. The method comprises the step of: (1) providing a substrate; (2) forming a light-emitting member in a process comprising the steps of: (a) depositing a first electrically conducting material on one surface of said substrate to form a first electrode; (b) depositing said at least one organic EL material on said first electrode; and (c) depositing a second electrically conducting material on said organic EL material to form a second electrode; and (3) disposing at least one organic PL material optically coupled with said light-emitting member.

According to one aspect of the present invention, the method for producing a light-emitting device further comprises the step of disposing at least one inorganic PL material adjacent to the organic EL device and the organic PL material. The inorganic PL material absorbs a second portion of the first spectrum and emits EM radiation having a third spectrum.

According to still another aspect of the present invention, the method for producing a light-emitting device further comprises disposing nanoparticles or microparticles of a scattering material adjacent to the organic and/or inorganic PL materials.

Other features and advantages of the present invention will be apparent from a perusal of the following detailed description of the invention and the accompanying drawings in which the same numerals refer to like elements.

DETAILED DESCRIPTION

The present invention provides a light-emitting device, a light source, or a display wherein light emits from an organic EL material and is modified by organic and inorganic PL materials to provide light having a desired color. As used herein, the terms "PL material" and "phosphor" are used interchangeably. A light-emitting device of the present invention comprises a light-emitting member based on the organic EL material and one or more PL materials disposed adjacent to the light-emitting member to absorb a portion of light emitted therefrom and convert that portion of light to light having another spectrum. In one embodiment of the present invention, the light-emitting member is disposed on a substrate. In this embodiment, the organic EL and organic and inorganic PL materials are formed to cover a substantial portion, for example, greater than about 10 percent and up to substantially 100 percent of the surface area of the substrate. In another embodiment of the present invention, the light-emitting member is formed into objects having desired shapes on the substrate. Each of such desired shapes is characterized by a continuous area having no discontinuity discernible by a naked eye. Organic EL materials are capable of emitting light having various wavelength ranges from near UV to red. Preferred organic EL materials for the present invention are those having emission spectra in the range from near UV to blue (i.e., wavelengths from about 300 nm to about 500 nm).

Figure 1:
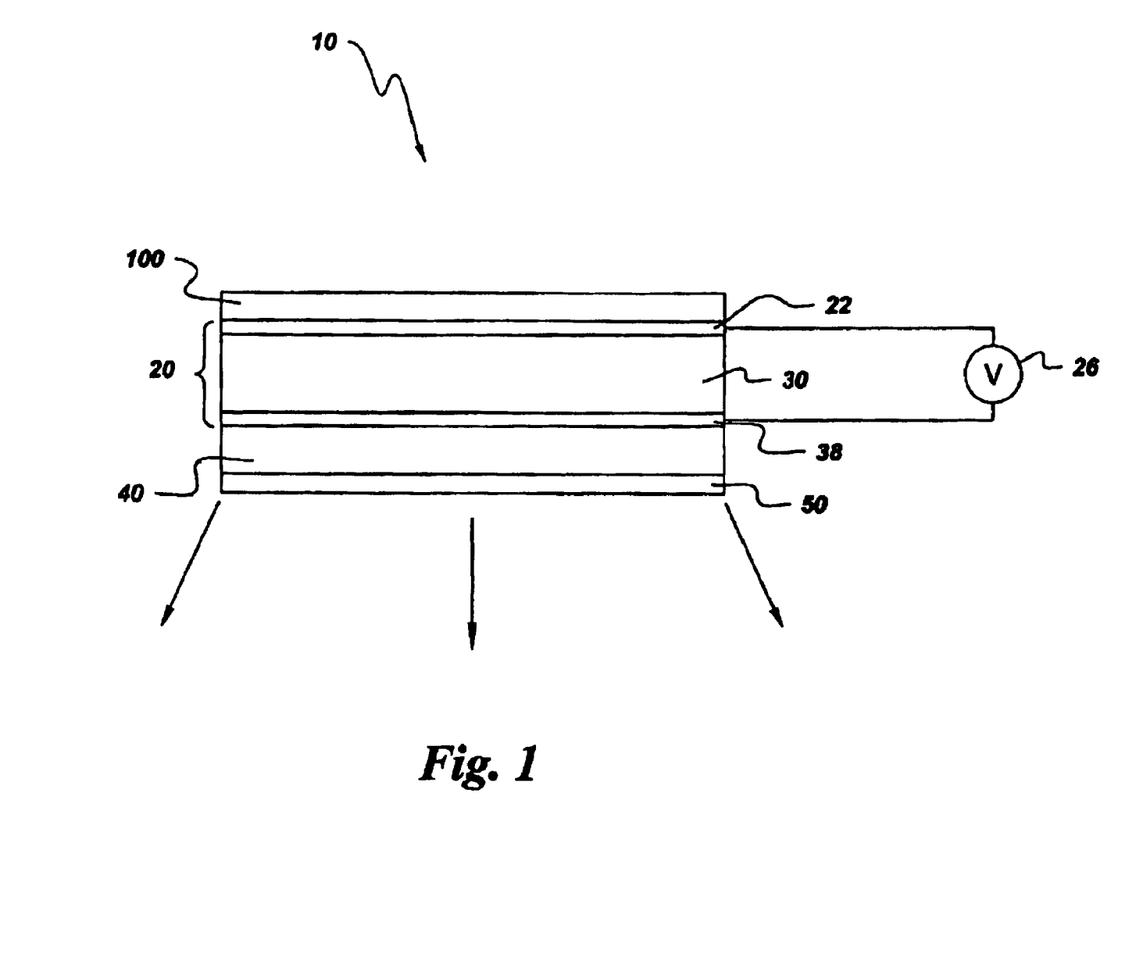
FIG. 1 shows schematically an embodiment comprising a light-emitting member and a layer of an organic PL material.

FIG. 1 is a schematic diagram of a first embodiment of the present invention. It should be understood that the figures accompanying this disclosure are not drawn to scale. Light-emitting device 10 comprises a light-emitting member 20 based on at least an organic EL material. Light-emitting member 20 is disposed on a substrate 40, which may be made of glass or a polymeric material. A layer 50 comprising at least one organic PL material is disposed to receive at least a portion of light emitted from the light-emitting member 20. The organic PL layer may or may not scatter light outside its optical absorption. A protective layer 100 is optionally disposed adjacent to a surface of light-emitting member 20 opposite to substrate 40. Protective layer 100 serves to provide protection against physical damage of chemical attack to the sensitive components of light-emitting member 20. Protective layer 100 can comprise a substantially transparent polymer or a glass. In a preferred embodiment, layer 50 is disposed adjacent to substrate 40 opposite to light-emitting member 20. However, it can be envisioned that a layer of PL material also may be disposed adjacent to protective layer 100. In addition, edges of light-emitting device 10 may be desirably sealed with a sealant, such as an epoxy resin.

Substrate 40 may be a single piece or a structure comprising a plurality of adjacent pieces of different materials and has an index of refraction (or refractive index) in the range from about 1.05 to about 2.5, preferably from about 1.1 to 1.55. Preferably, substrate 40 is made of a substantially transparent glass or polymeric material. The term "substantially transparent" means allowing at least 80 percent, preferably at least 90 percent, and more preferably at least 95 percent, of light in the visible wavelength range transmitted therethrough. Examples of suitable polymeric materials are polyethylenterephathalate ("PET"), polyacrylates, polycarbonate, silicone, epoxy resins, and silicone-functionalized epoxy resins. In one embodiment of the present invention, the organic PL material may be dispersed in the substrate material.

Light-emitting member 20 comprises at least one layer 30 of at least one organic EL material sandwiched between two electrodes 22 and 38. As will be disclosed below, the light-emitting member may comprise one or more additional layers between an electrode and the layer 30 of organic EL material. When a voltage is supplied by a voltage source 26 and applied across electrodes 22 and 38, light emits from the organic EL material. In a preferred embodiment, electrode 22 is a cathode injecting negative charge carriers (electrons) into organic EL layer 30 and is made of a material having a low work function; e.g., less than about 4 eV. Low-work function materials suitable for use as a cathode are K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode layer 22 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, covered by a thicker layer of some other metal, such as aluminum or silver. In this embodiment, electrode 38 is an anode injecting positive charge carriers (or holes) into organic layer 30 and is made of a material having a high work function; e.g., greater than about 4.5 eV, preferably from about 5 eV to about 5.5 eV. Indium tin oxide ("ITO") is typically used for this purpose. ITO is substantially transparent to light transmission and allows at least 80% light transmitted therethrough. Therefore, light emitted from organic electroluminescent layer 30 can easily escape through the ITO anode layer without being seriously attenuated. Other materials suitable for use as the anode layer are tin oxide, indium oxide, zinc oxide, indium zinc oxide, and mixtures thereof. Electrode layers 22 and 38 may be deposited on the underlying element by physical vapor deposition, chemical vapor deposition, or sputtering. A thin, substantially transparent layer of a metal is also suitable.

Although the preferred order of the cathode and anode layers 22 and 38 is disclosed above, the electrode layers may be reversed. Electrode layers 22 and 38 may serve as the anode and cathode, respectively. In this configuration, the thickness of cathode layer 38 is preferably kept to a minimum so that light emitted from organic layer 30 is not seriously attenuated as it travels through cathode layer 38.

Organic EL layer 30 serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 40 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly(n-vinylcarbazole) ("PVK", emitting violet-to-blue light in the wavelengths of about 380–500 nm); poly(alkylfluorene) such as poly (9,9-dihexylfluorene) (410–550 nm), poly(dioctylfluorene) (wavelength at peak EL emission of 436 nm), or poly{9,9-bis(3,6-dioxaheptyl)-fluorene-2,7-diyl} (400–550 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly(methylphenyisilane), and poly{bis (p-butylphenyl)silane} which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris{n-(4-diphenylaminophenyl)phenylamino}benzene, which emits light in the wavelength range of 380–500 nm. The organic EL layer also may be prepared from lower molecular weight organic molecules, such as 9-phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis{2,6-di(t-butyl)phenoxide} or scandium-(4-methoxy-picolylmethylketone)-bis(acetylacetonate), which emits in the range of 420–433 nm. For white light application, the preferred organic EL materials are those emit light in the blue-green wavelengths.

More than one organic EL layer may be formed successively one on top of another, each layer comprising a different organic EL material that emits in a different wavelength range. Such a construction can facilitate a tuning of the color of the light emitted from the overall light-emitting device 10.

Figure 2:
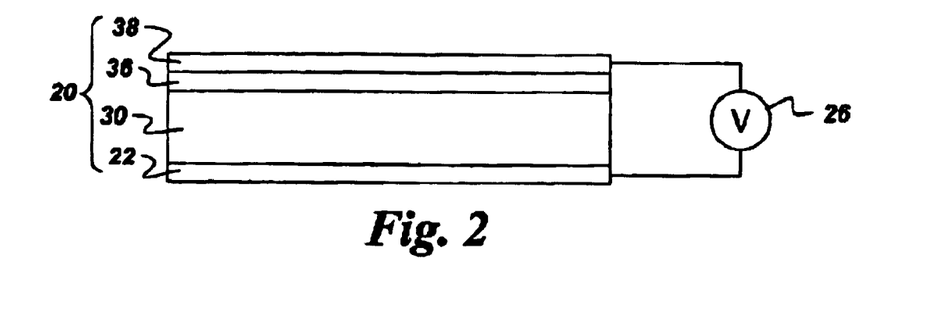
FIG. 2 shows schematically a light-emitting member including a hole injection enhancement layer.

Furthermore, one or more additional layers may be included in light-emitting member 20 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. Materials for these additional layers are typically low-to-intermediate molecular weight (less than about 2000) organic molecules. They may be applied during the manufacture of the device 10 by conventional methods such as spray coating, dip coating, or physical or chemical vapor deposition. In one embodiment of the present invention, as shown in FIG. 2, a hole injection enhancement layer 36 is formed between the anode layer 38 and the organic EL layer 30 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis (1,3-dithiole).

Figure 3:
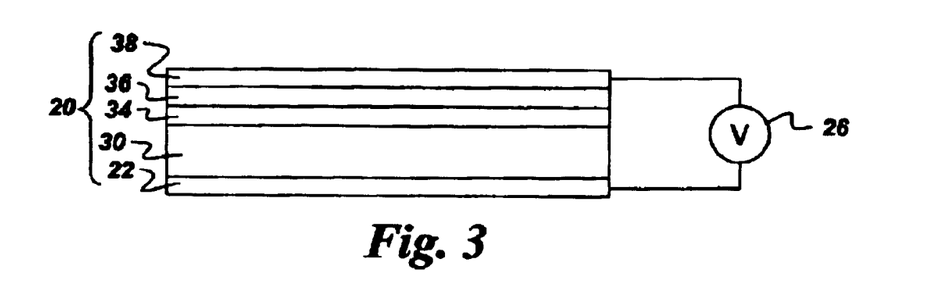
FIG. 3 shows schematically a light-emitting member including a hole injection enhancement layer and a hole transport layer.

In another embodiment of the present invention, as shown in FIG. 3, light-emitting member 20 further includes a hole transport layer 34 which is disposed between the hole injection enhancement layer 36 and the organic EL layer 30. The hole transport layer 34 has the functions of transporting holes and blocking the transportation of electrons so that holes and electrons are optimally combined in the organic EL layer 30. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Figure 4:
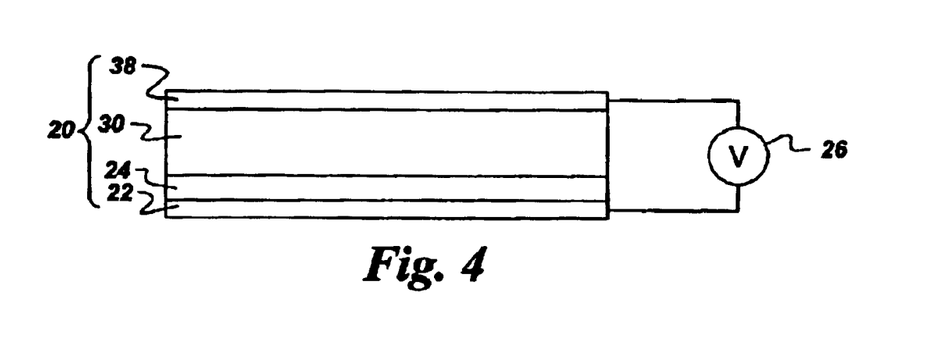
FIG. 4 shows schematically a light-emitting member including an electron injection enhancement and transport layer.

In still another embodiment of the present invention, as shown schematically in FIG. 4, light-emitting member 20 includes an additional layer 24 which is disposed between the cathode layer 22 and the organic EL layer 30. Layer 24 has the combined function of injecting and transporting electrons to the organic EL layer 30. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

Suitable organic PL materials for being incorporated into a light-emitting device 10 of the present invention absorb a portion of the light emitted by light-emitting member 20 in a shorter wavelength range of the visible spectrum and emit light in a longer wavelength range in the visible spectrum. These organic PL materials typically have rigid molecular structure and are extended π-systems. They typically have small Stokes shifts and high quantum efficiency. For example, organic PL materials that exhibit absorption maxima in the blue portion of the spectrum exhibit emission in the green portion of the spectrum. Similarly, those that exhibit absorption maxima in the green portion of the spectrum exhibit emission the yellow or orange portion of the spectrum. Such small Stokes shifts give the organic PL materials high quantum efficiencies.

Suitable classes of organic PL materials are the perylenes and benzopyrenes, coumarin dyes, polymethine dyes, xanthene dyes, oxobenzanthracene dyes, and perylenebis (dicarboximide) dyes disclosed by Tang et al. in U.S. Pat. No. 4,769,292 which is incorporated herein by reference. Other suitable organic PL materials are the pyrans and thiopyrans disclosed by Tang et al. in U.S. Pat. No. 5,294,870 which is incorporated herein by reference. Still other suitable organic PL materials belong to the class of azo dyes, such as those described in P. F. Gordon and P. Gregory, "Organic Chemistry in Colour," Springer-Verlag, Berlin, pp. 95–108 (1983). Preferred organic PL materials are those that absorb a portion of the green light emitted by the light-emitting member and emit in the yellow-to-red wavelengths of the visible spectrum. Such emission from these organic PL materials coupled with the portion of unabsorbed light from the light-emitting member produces light that is close to the black-body radiation locus.

The organic PL materials may be deposited on the second electrode 38 of the light-emitting member 20 by physical vapor deposition, spraying, spin coating, dip coating, or printing such as ink-jet printing. They also may be dispersed in a substantially transparent polymeric material such as polyacrylates, polycarbonate, PET, silicone, epoxy, or derivatives thereof. Then, the mixture is formed by casting into a film 50 that is subsequently disposed on the light-emitting member 20.

Figure 5:
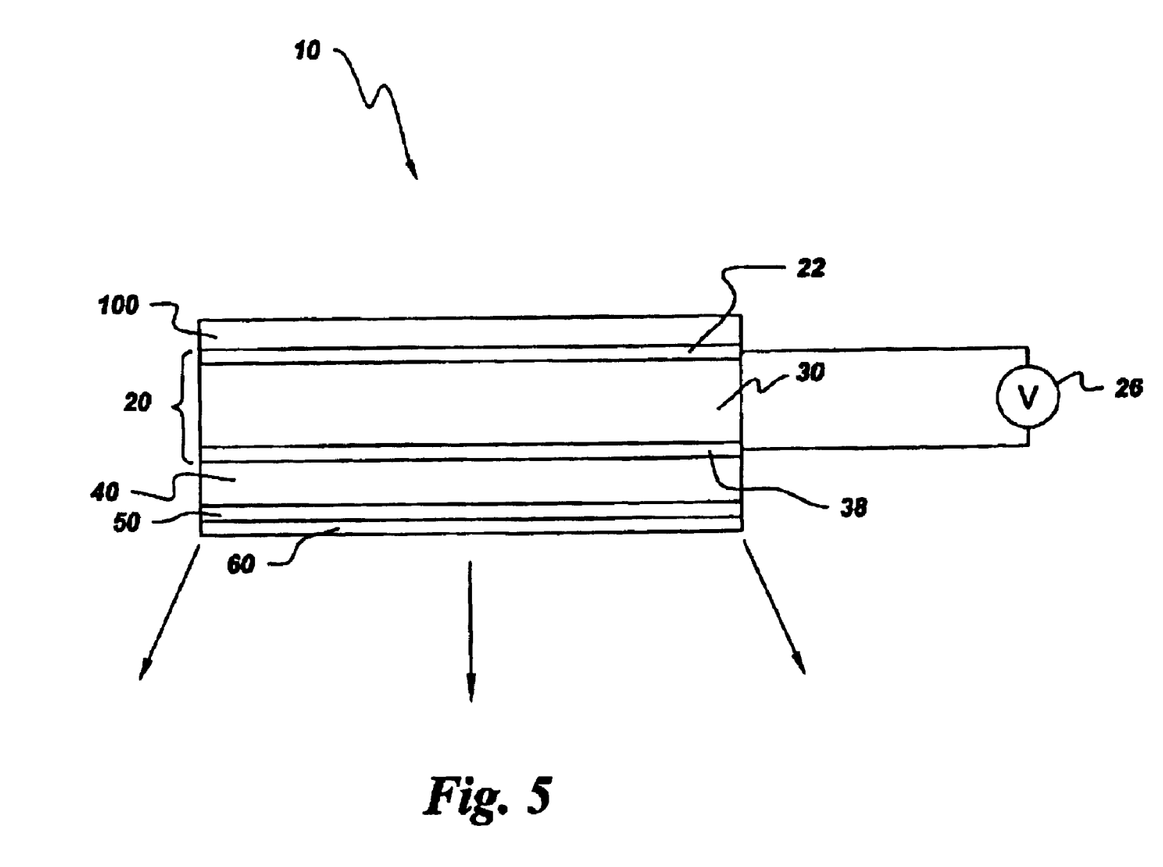
FIG. 5 shows schematically an embodiment comprising a light-emitting member, a layer of an organic PL material, and a layer of an inorganic PL material.

In another embodiment of the present invention as illustrated in FIG. 5, light-emitting device 10 further comprises a layer 60 comprising at least one inorganic PL material (or a phosphor) that is disposed adjacent to the organic PL layer 50. Although the organic PL layer 50 is shown in FIG. 5 to be between the light-emitting member 20 and the inorganic PL layer 60, layer 60 may also be disposed between light-emitting member 20 and organic PL layer 50. The particle size and the interaction between the surface of the particle and the polymeric medium determine how well particles are dispersed in polymeric materials to form the film or layer 60. Many micrometer-sized particles of oxide materials, such as zirconia, yttrium and rare-earth garnets, and halophosphates, disperse well in standard silicone polymers, such as poly (dimethylsiloxanes) by simple stirring. If necessary, other dispersant materials (such as a surfactant or a polymeric material like poly(vinyl alcohol)) may be added such as are used to suspend many standard phosphors in solution. The phosphor particles may be prepared from larger pieces of phosphor material by any grinding or pulverization method, such as ball milling using zirconia-toughened balls or jet milling. They also may be prepared by crystal growth from solution, and their size may be controlled by terminating the crystal growth at an appropriate time. The preferred phosphor materials efficiently absorb EM radiation emitted by the organic EL material and re-emit light in another spectral region. Such a combination of the organic EL material and the phosphor allows for a flexibility in tuning the color of light emitted by the light-emitting device 10. A particular phosphor material or a mixture of phosphors may be chosen to emit a desired color or a range of color to complement the color emitted by the organic EL material and that emitted by the organic PL materials. An exemplary phosphor is the cerium-doped yttrium aluminum oxide $Y_3Al_5O_{12}$ garnet ("YAG:Ce"). Other suitable phosphors are based on YAG doped with more than one type of rare earth ions, such as $(Y^{1-x-y}Gd_xCe_y)_3Al_5O_{12}$("YAG:Gd,Ce"), $(Y_{1-x}Ce_x)_3$ $(Al_{1-y}Ga_y)O_{12}$("YAG:Ga,Ce"), $(Y_{1-x-y}Gd_xCe_y)(Al_{5-z}Ga_z)$ $O_{12}$("YAG:Gd,Ga,Ce"), and $(Gd_{1-x}Ce_x)Sc_2Al_3O_{12}$ ("GSAG") where $0 \leqq x \leqq 1$, $0 \leqq y \leqq 1$, $0 \leqq z \leqq 5$ and $x+y \leqq 1$. For example, the YAG:Gd,Ce phosphor shows an absorption of light in the wavelength range from about 390 nm to about 530 nm (i.e., the blue-green spectral region) and an emission of light in the wavelength range from about 490 nm to about 700 nm (i.e., the green-to-red spectral region). Related phosphors include $Lu_3Al_5O_{12}$ and $Tb_2Al_5O_{12}$, both doped with cerium. In addition, these cerium-doped garnet phosphors may also be additionally doped with small amounts of Pr (such as about 0.1–2 mole percent) to produce an additional enhancement of red emission. The following are examples of phosphors that are efficiently excited by EM radiation emitted in the wavelength region of 300 nm to about 500 nm by polysilanes and their derivatives.

Green-emitting phosphors: $Ca_8Mg(SiO_4)_4Cl_2:Eu^{2+}$, $Mn^{2+}$; $GdBO_3:Ce^{3+}$, $Tb^{3+}$; $CeMgAl_{11}O_{19}$: $Tb^{3+}$; $Y_2SiO_5:Ce^{3+}$, $Tb^{3+}$; and $BaMg_2Al_{16}O_{27}:Eu^{2+},Mn^{2+}$.

Red-emitting phosphors: $Y_2O_3:Bl^{3+},Eu^{3+}$; $Sr_2P_2O_7:Eu^{2+}$, $Mn^{2+}$; $SrMgP_2O_7:Eu^{2+},Mn^{2+}$; $(Y,Gd)(V,B)O_4:Eu^{3+}$; and $3.5MgO.0.5MgF_2,GeO_2:Mn^{4+}$ (magnesium fluorogermanate).

Blue-emitting phosphors: $BaMg_2Al_{16}O_{27}:Eu^{2+}$; $Sr_5(PO_4)_{10}Cl_2:Eu^{2+}$; and $(Ba,Ca,Sr)_5(PO_4)_{10}(Cl,F)_2:Eu^{2+}$,(Ca,Ba,Sr)(Al,Ga)$_2$S$_4$:Eu$^{2+}$.

Yellow-emitting phosphors: $(Ba,Ca,Sr)_5(PO^4)_{10}$ $(Cl,F)_2:Eu^{2+},Mn^{2+}$.

Still other ions may be incorporated into the phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

The phosphor particles are dispersed in a film-forming polymeric material, such as polyacrylates, substantially transparent silicone or epoxy. A phosphor composition of less than about 30, preferably less than about 10, percent by volume of the mixture of polymeric material and phosphor is used. A solvent may be added into the mixture to adjust the viscosity of the film-forming material to a desired level. The mixture of the film-forming material and phosphor particles is formed into a layer by spray coating, dip coating, printing, or casting on a substrate. Thereafter, the film is removed from the substrate and disposed on the light-emitting member 20. The thickness of film or layer 50 and 60 is preferably less than 1 mm, more preferably less than 500 μm. Preferably, the film-forming polymeric materials have refractive indices close to those of the substrate 40 and the organic EL material; i.e., in the range from about 1.4 to 1.6.

Figure 6:
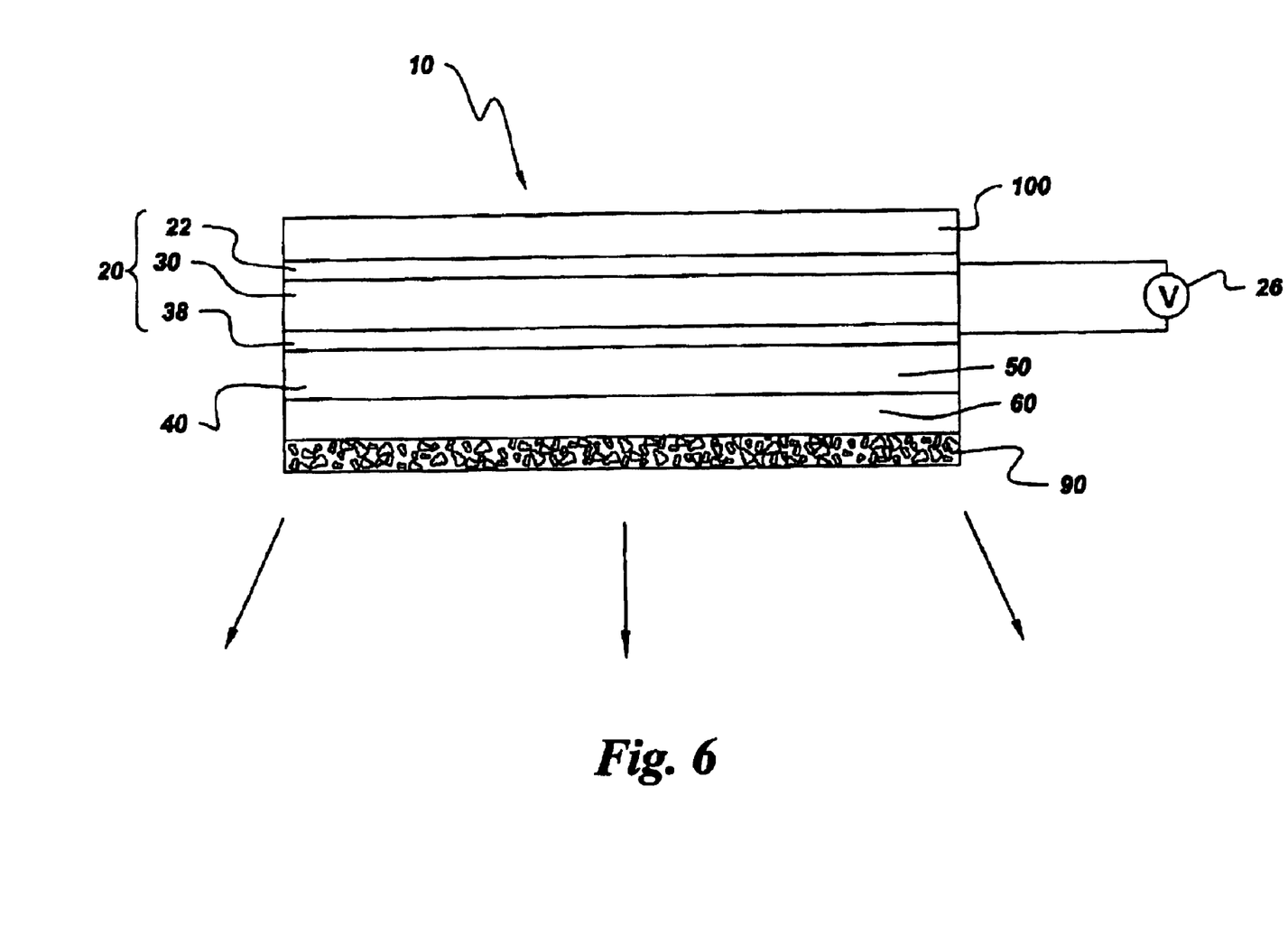
FIG. 6 shows schematically the embodiment of FIG. 5 with an additional layer of a light-scattering material.
Figure 7:
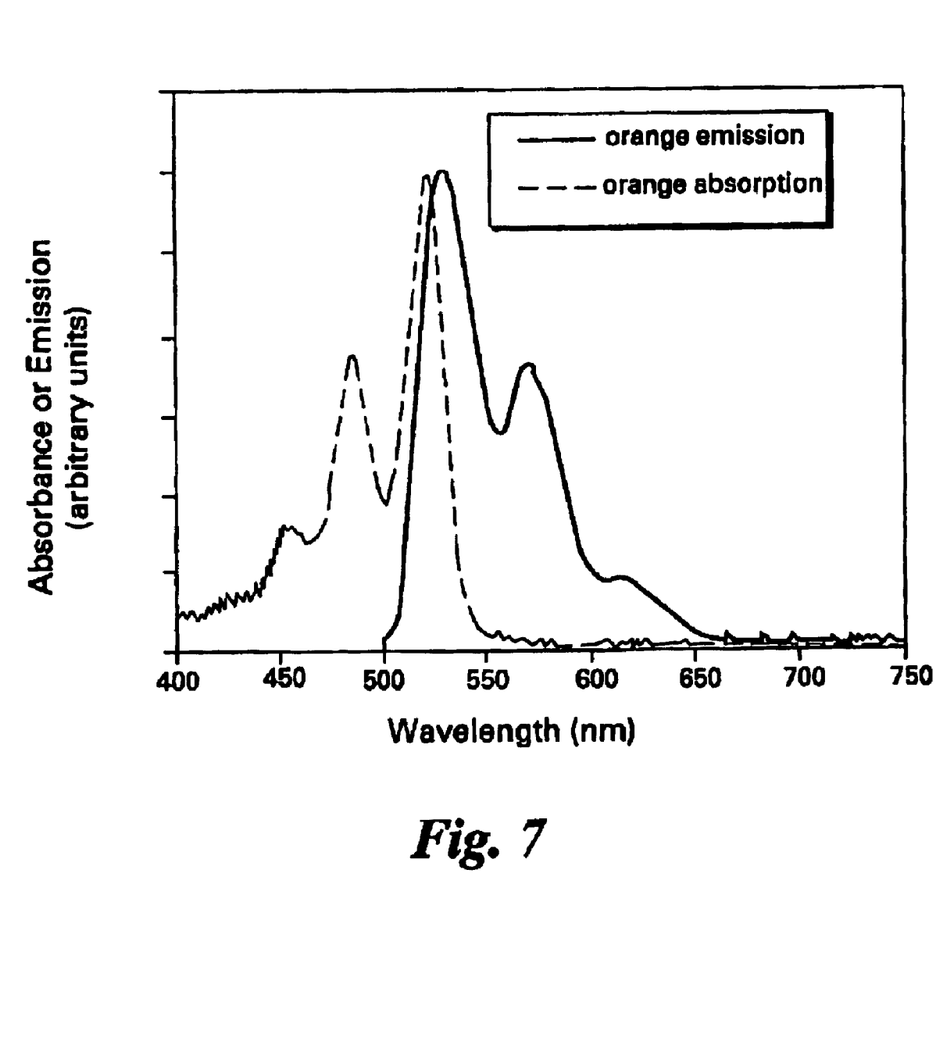
FIG. 7 shows the absorption and emission spectra of LUMOGEN® F ORANGE 240.
Figure 8:
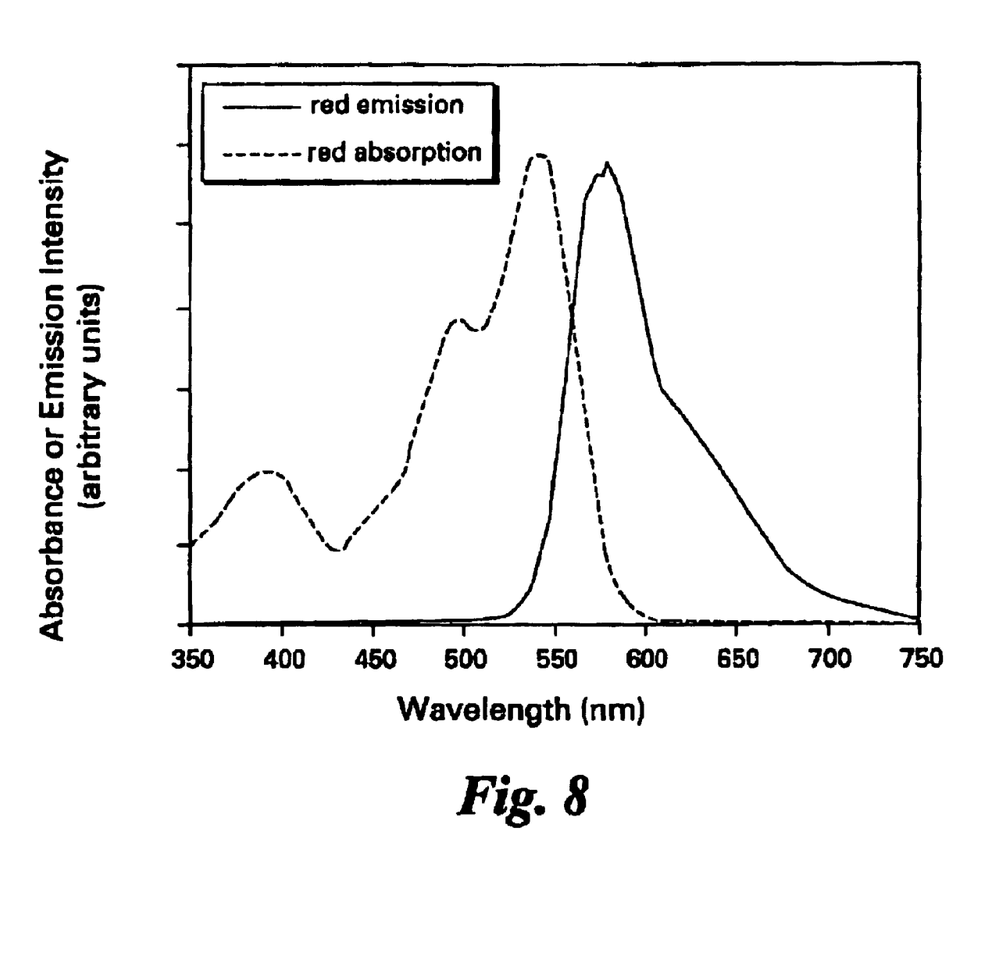
FIG. 8 shows the absorption and emission spectra of LUMOGEN® F RED 300.
Figure 9:
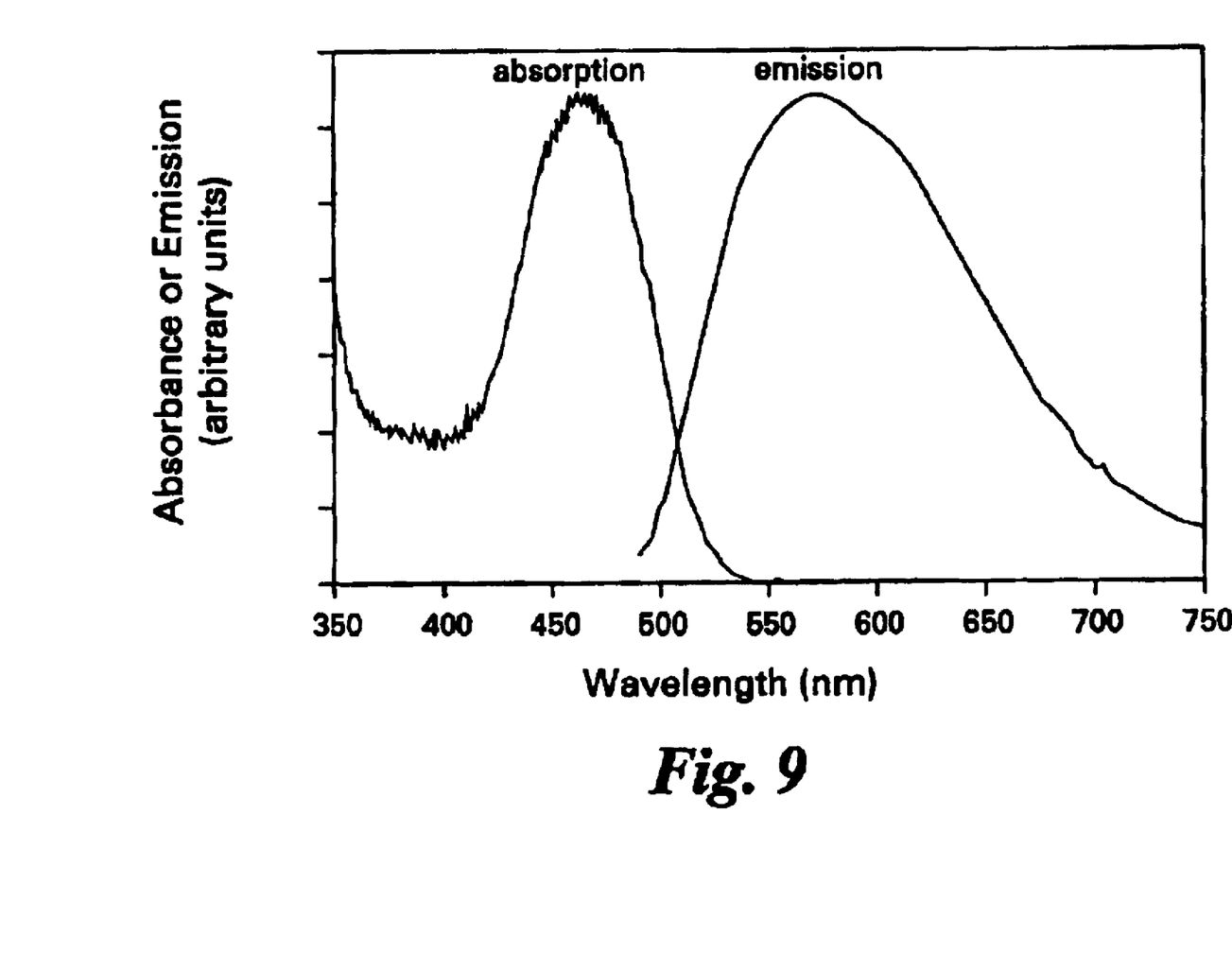
FIG. 9 shows the absorption and emission spectra of cerium-doped yttrium gadolinium aluminum garnet phosphor.

In another embodiment of the present invention, the light-emitting device 10 further comprises a light-scattering material disposed in the path of light emitted from the light-emitting device 10 to provide more uniform light therefrom. For example FIG. 6 illustrates an embodiment comprising a layer 90 of scattering material disposed on the layer 60 of an inorganic PL material. The light-scattering material is provided by choosing particles that range in size from about 10 nm to about 100 micrometers. A preferred embodiment includes particles about 4 micrometers in size. For example, for a device emitting white light, the particle size is preferably on the order of 50–65 nm. Particles of the light-scattering material may be advantageously dispersed in a substantially transparent polymeric film-forming material such as those disclosed above, and the mixture is formed into a film which may be disposed on the light-emitting device 20. Alternatively, particles of the light-scattering material may be dispersed into the film or layer carrying the organic or inorganic PL material. Suitable light-scattering materials are solids having refractive index higher than that of the film forming material. Since typical film forming materials have refractive indices between about 1.3 to about 1.6, the particulate scattering material should have a refractive index higher than 1.6 and should be optically transparent over the target wavelength range. In addition, it is preferable that the light scattering material be non-toxic and substantially resistant to degradation upon exposure to normal ambient environments. For a device designed to provide visible illumination (wavelength in the range of about 390–750 nm), examples of suitable light-scattering materials are rutile ($TiO_2$), hafnia ($HfO_2$) zirconia($ZrO_2$) zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide. It is necessary to prepare these compounds with a high degree of optical purity; i.e. impurities that absorb light in the wavelength range of interest must be rigorously minimized. It is not necessary that the compound be stoichiometrically pure, phase pure, and may contain appropriate atomic substitutions, e.g. Gd may be substituted for up to 60% of the yttrium in YAG. Particles composed of high index glasses, such as may be obtained from Schott or Corning, may also be used, provided that they are impervious to darkening from exposure to light emitted by the OELD and its phosphors.

In another embodiment of the present invention, the scattering material may be a substantially homogeneous solid single crystal or ceramic, or simply particles attached to a surface of the light-emitting device by an adhesive material. Thus, the degree of light scattering by the inorganic material may be tuned from totally transparent to highly light scattering, and the light scattering may occur either at a surface or within a volume.

In another embodiment of the present invention, the light-emitting device comprising a substrate, a light-emitting member and at least one of a layer of organic PL material, a layer of inorganic PL material, a layer of light-scattering material, and a multilayered barrier coating is encapsulated in a substantially transparent polymeric material, such as one selected from the group consisting of silicone, epoxy, and silicon-functionalized epoxy.

A method of making a light-emitting device is now described. A substrate such as a large-area piece of glass or plastic is first provided. A first electrically conducting material is deposited on one surface of the substrate to form a first electrode. The first electrode may be an anode or a cathode, and one or more appropriate materials are chosen among those disclosed earlier for the electrodes. The first electrode material preferably sputter-deposited on the substrate. Furthermore, the first electrode may be patterned to a desired configuration by, for example, etching. At least one organic EL material is deposited on the first electrode by physical or chemical vapor deposition, spin coating, dip coating, spraying, ink-jet printing, or casting, followed by polymerization, if necessary, or curing of the material. The organic EL material may be diluted in a solvent to adjust its viscosity or mixed with another polymeric material that serves as a film-forming vehicle. A second electrically conducting material is deposited on the at least one organic EL material to form a second electrode. The second electrode may be deposited on the entire area of the organic EL material or patterned into a desired shape or configuration. At least one of the electrodes is substantially transparent. The electrodes and the organic EL material comprise a light-emitting member. At least one organic PL material is disposed adjacent to the light-emitting member to receive EM radiation emitted therefrom. The at least one organic PL material may be deposited on a surface of the light-emitting member, for example by physical or chemical vapor deposition, spraying, spin coating, dip coating, or ink-jet printing. Alternatively, the organic PL material is dispersed in a substantially transparent polymeric material, such as polyacrylates, polycarbonate, PET, silicone, or epoxy, and the mixture is deposited on a surface of the light-emitting member in the form of a layer or film by physical or chemical vapor deposition, spin coating, dip coating, spraying, or ink-jet printing. The organic PL material is preferably deposited, or a film containing it is preferably formed, on the same side of the light-emitting member as the transparent electrode.

Alternatively, the mixture may be cast into a film separately, and the film is attached to a surface of the light-emitting member. The method can include the optional step of forming one or more additional layers serving as hole injection enhancement layer, hole transport layer, and electron injection enhancement and transport between an electrode and the layer of organic EL material.

In another embodiment, subsets of layers necessary or desired for the operation of an organic light-emitting device are formed in separate assemblies, and the assemblies are laminated or attached together to produce a working device.

In still another embodiment of the present invention, the method further comprises disposing an inorganic PL material adjacent to at least one of the organic EL material and the organic PL material. At least one inorganic PL material is dispersed in a substantially transparent polymeric material, such as those disclosed above, and the mixture is deposited on the film or layer of organic PL material by spin coating, dip coating, spraying, or ink-jet printing. Alternatively, the mixture may be cast into a film separately, and the film is attached to the layer of the organic PL material. It is understood that the order of PL layers may be reversed; i.e., the inorganic PL layer may be first attached to the light-emitting member, and the organic PL layer is attached on the inorganic PL layer.

In still another embodiment of the present invention, particles of at least one light-scattering material are dispersed in a substantially transparent polymer, such as those disclosed above, and the mixture is disposed adjacent to at least one of the organic EL material, the organic PL material, and the inorganic PL material. The mixture may be deposited on the layer or film of inorganic PL material. Alternatively, the mixture may be cast into a film separately, and the film is attached to the layer or film of the inorganic PL material. To activate the light-emitting device, an electrical voltage source is applied across the two electrodes.

Large-area light-emitting devices may be produced by laminating together a large-area light-emitting member already formed on a large-area piece of plastic or glass substrate and at least one film comprising at least one organic PL material. Additional films, each comprising at least one inorganic PL material or light-scattering material may also be laminated at the same time.

Large-area light-emitting devices of the present invention are advantageously used to provide illumination of large areas.

Several light-emitting devices of the present invention may be disposed on a support to display desired messages or signs.

EXAMPLE

Figure 10:
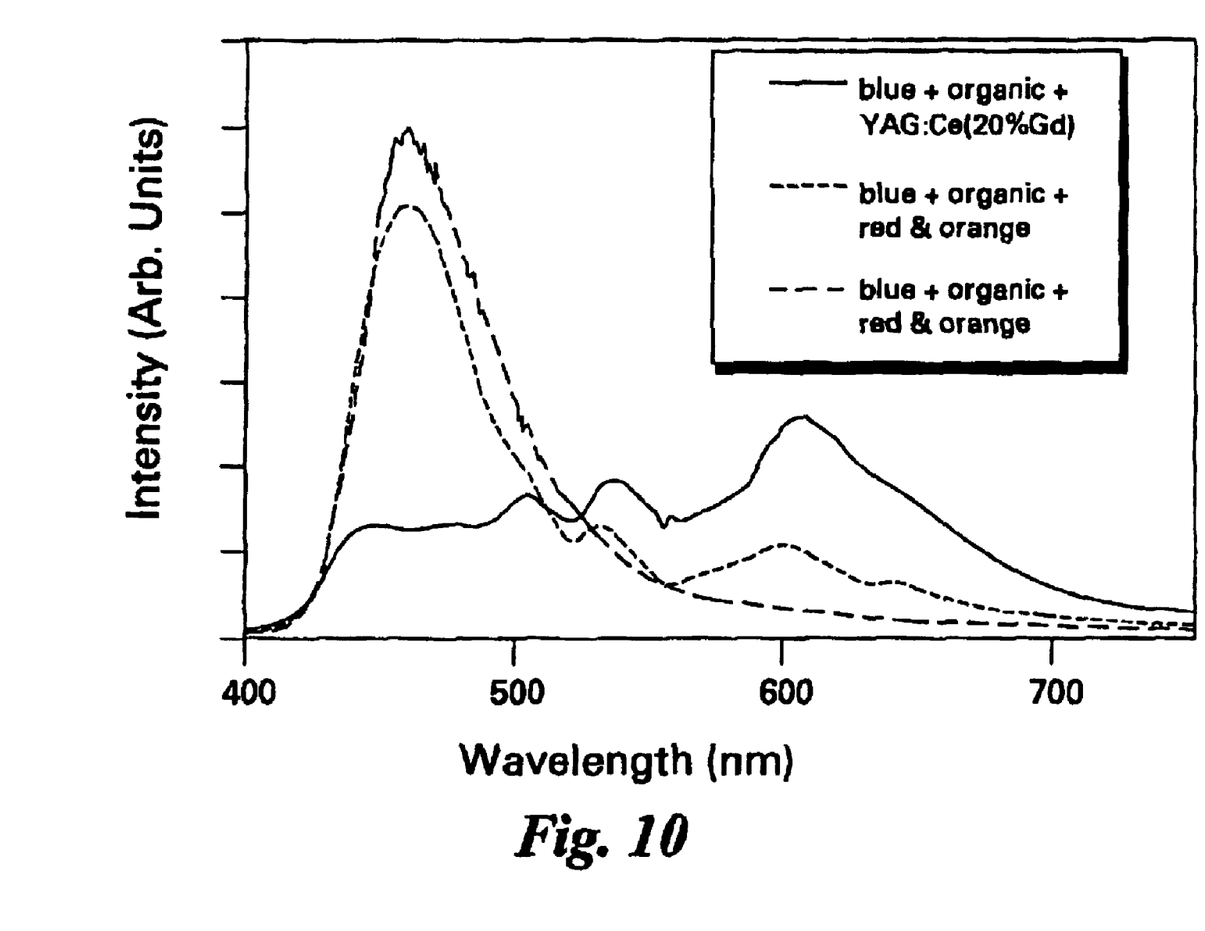
FIG. 10 shows the emission spectra of a light-emitting member comprising a blue light-emitting organic EL material, the same coupled with a layer of LUMOGEN® F ORANGE 240 and LUMOGEN® F RED 300, and the same coupled with a layer of LUMOGEN® F ORANGE 240 and LUMOGEN® F RED 300, and a layer of cerium-doped yttrium gadolinium aluminum garnet phosphor.

A light-emitting device of the present invention was constructed on a glass substrate having a dimension of about 5 cm×5 cm. It is understood that devices having larger areas may be made according to the method disclosed herein. Soda lime glass substrates with a transparent, low resitivity (15 Ohms/square) ITO film on one side were obtained from Applied Films Corporation. The ITO was then patterned by use of standard photolithography techniques. Following a solvent clean and oxygen plasma treatment, a thin (60 nm) film of poly(3,4)-ethylenedioxythiophene/polystyrene sulfonate ("PEDOT/PSS") polymer was immediately deposited atop the ITO via spin casting. The PEDOT/PSS solution was obtained from Bayer AG of Germany under the name of Baytron P, and was used as received. The resulting film was baked under a nitrogen atmosphere for one hour at 200° C. A blue light-emitting organic EL material obtained from Cambridge Display Technologies (Cambridge, England) was deposited by spin coating atop the PEDOT/PSS layer to a thickness of about 60–70 nm. A bilayer cathode consisting of a layer of NaF having a thickness of about 4 nm and a layer of aluminum having a thickness of about 150 nm was deposited by evaporation atop the blue light-emitting material. A second piece of glass was placed atop the cathode layer and the edges sealed with an epoxy in order to protect the device from attack by water and oxygen. Organic orange dye LUMOGEN® F ORANGE 240 and organic red dye LUMOGEN® F RED 300, obtained from BASF AG of Germany, were first dissolved at an approximate concentration of 1 mg/ml into spectroscopic grade acetone solvent. Following dissolution of the dye into acetone, between 0.5 ml and 2.5 ml of the dye solution was dispersed into 16 g of 30% (parts by weight in parts by volume) polymethylmethacrylate ("PMMA") in butyl acetate solvent. The dye/polymer solution was then mixed until it was substantially homogeneously dispersed and the tape-cast by the doctor blade method. The butyl acetate solvent was allowed to evaporate, and the final thickness of the PMMA/dye film was about 75–100 $\mu$m. These dyes are of the perylene dye family. The optical density of the films at their peak absorption wavelength (about 524 nm for the orange dye and about 574 nm for the red dye) was about 0.1 absorbance units. The PMMA layer containing the organic dyes was then attached to the second glass piece by a piece of 3M clear laminating tape (3M Corporation, Minneapolis, Minn.). Cerium-doped yttrium gadolinium aluminum garnet phosphor having chemical composition of $(Y_{0.78}Gd_{0.19}Ce_{0.03})_3Al_5O_{12}$ and a particle size of about 2–10 $\mu$m (average particle size of about 4 $\mu$m) was dispersed in Dow Corning Sylgard™ 184 silicone. The mixture was degassed and tape-cast by the doctor blade method to a film. The film was then cured at 90° C. for about 1–2 hours. The final film thickness was about 400 $\mu$m following cure. The composition of the phosphor in the mixture was about 2.1 percent by volume. The phosphor film was then attached to the organic dye layer by a piece of 3M clear laminating tape. Absorption and emission spectra of LUMOGEN® F ORANGE 240 and LUMOGEN® F RED 300 are shown in FIGS. 10 and 11. Absorption and emission spectra of cerium-doped yttrium gadolinium garnet phosphor are shown in FIG. 12. Emission spectra of the blue light-emitting organic EL material, the device with only the organic EL material and the organic dye layer, and the device with both the organic dye and the inorganic phosphor layers are shown in FIG. 13. The device with the organic EL material and both the organic dye and inorganic phosphor layers has a correlated color temperature ("CCT") of 4130 K, a color rendition index ("CRI") of 93, and a distance from the black body locus of less than 0.01. A wide range of CCTs from about 3000 K to about 6000 K and CRI from about 60 to about 95 can be readily obtained with devices of the present invention, depending on combinations of the organic light-emitting material and the PL materials. White light sources typically have CCTs in the range from about 3000 to about 6500 K. Fluorescent light with phosphors excited by UV radiation has CCT of 3000–6000 K and CRI of 60–80. Therefore, the light source of the present invention can provide light having similar CCT but better CRI than fluorescent light.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

What is claimed is:

1. A light-emitting device comprising a light-emitting member that comprises a first electrode, a second electrode, and at least one organic electroluminescent ("EL") material disposed between said first and second electrodes, said light-emitting member being disposed on a substrate and emitting first electromagnetic ("EM") radiation having a first spectrum when an electrical voltage is applied across said electrodes; and at least one organic photoluminescent ("PL") material disposed separetely from said electroluminescent material in a path of light emitted by said light-emitting member, said organic PL material absorbing a portion of said first EM radiation and emitting second EM radiation having a second spectrum.

2. The light-emitting device according to claim 1, wherein said organic PL material is dispersed in a layer of polymeric material, said layer being disposed on said light-emitting member.

3. The light-emitting device according to claim 1, wherein said first electrode comprises a material selected from the group consisting of K, Li, Na, Mg, La, Ce, Ca, Sr, Ba, Al, Ag, In, Sn, Zn, Zr, Sm, Eu, alloys thereof, and mixtures thereof.

4. The light-emitting device according to claim 1, wherein said at least one organic EL material is selected from the group consisting of poly(n-vinylcarbazole), poly (alkylfluorene), poly(paraphenylene), polysilanes, derivatives thereof, mixtures thereof, and copolymers thereof.

5. The light-emitting device according to claim 1, wherein said second electrode comprises a materials elected from the group consisting of ITO, tin oxide, indium oxide, zinc oxide, indium zinc oxide, and mixtures thereof.

6. The light-emitting device according to claim 1, wherein said organic PL material is at least one material selected from the group consisting of perylenes, benzopyrenes, coumarin dyes, polymethine dyes, xanthene dyes, oxobenzanthracene dyes, perylenebis(dicarboximide), pyrans, thiopyrans, and azo dyes.

7. The light-emitting device according to claim 1, wherein said inorganic PL material is at least one material selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_x(Ce_y)(Al_{5-z}Ga_z)O_{12}$; $(Gd_{1-x}Ce_x)Sc_2Al_3O_{12}$; $Ca_8Mg(SiO_4)_4Cl_2:Eu^{2+},Mn^{2+}$; $GdBO_3:Ce^{3+},Tb^{3+}$; $CeMgAl_{11}O_{19}:Tb^{3+}$; $Y_2SiO_5:Ce^{3+},Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn_{2+}$; $SrMgP_2O_7:Eu^{2+},Mn^{2+}$; $(Y,Gd)(V,B)O_4:Eu^{3+}$; $3.5MgO.0.5MgF_2.GeO_2:Mn^{4+}$ (magnesium fluorogerminate); $BaMg_2Al_{16}O_{27}:Eu^{2+}$; $Sr_5(PO_4)_{10}Cl_2:Eu^{2+}$; $(Ca,Ba,Sr)(Al,Ga)_2S_4:Eu^{2+}$; $(Ba,Ca,Sr)_5(PO_4)_{10}(Cl,F)_2:Eu^{2+},Mn^{2+}$; $Lu_3Al_5O_{12}:Ce^{3+}$; $Tb_3Al_5O_{12}:Ce^{3+}$; and mixtures thereof; wherein $0 \leq x \leq 1$, $0 \leq y \leq$, $0 \leq z \leq 5$ and $x+y \leq 1$.

8. The light-emitting device according to claim 1 further comprising a light-scattering material disposed in a path of light emitted from said light-emitting member.

9. The light-emitting device according to claim 8, wherein said scattering material is in a form of particles having a size in a range from about 10 nm to about 100 micrometers that are dispersed in a film of a polymeric material.

10. The light-emitting device according to claim 9, wherein said film containing dispersed particles of light-scattering material is disposed adjacent to said inorganic PL material.

11. The light-emitting device according to claim 9, wherein said light-scattering material is selected from the group consisting of rutile ($TiO_2$), hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide, and mixtures thereof.

12. The light-emitting device according to claim 1, wherein said first spectrum has wavelengths in a range from near ultraviolet ("UV") to red.

13. The light-emitting device according to claim 12, wherein said wavelengths are in a range from about 300 nm to about 770 nm.

14. The light-emitting device according to claim 13, wherein said wavelengths are preferably in a range from about 300 nm to about 550 nm.

15. The light-emitting device according to claim 1, wherein said second spectrum has wavelengths in a range from about 500 to about 770 nm.

16. The light-emitting device according to claim 15, wherein said wavelengths are preferably in a range from about 550 nm to about 770 nm.

17. The light-emitting device according to claim 1, wherein said at least one organic EL material is selected from the group consisting of 1,3,5-tris{n-(4-diphenylaminophenyl)phenylamino)benzene, phenylanthracene, tetraarylethene, coumarin, rubrene, tetraphenylbutadiene, anthracene, perylene}, coronene, aluminum-(picolymethylketone)-bis{2,6-di(t-butyl) phenoxide, scandium-(4-methoxy-picolymethylketone)-bis (acetylacetonate), aluminum-acetylacetonate, gallium-acetylacetonate, and indium-acetylacetonate.

18. The light-emitting device according to claim 17, wherein said at least one organic EL material is carried in a substantially transparent polymer.

19. A light-emitting device comprising a light-emitting member that comprises a first electrode, a second electrode, and at least one organic electroluminescent ("EL") material disposed between said first and second electrode, said light-emitting member being disposed on a substrate and emitting first electromagnetic ("EM") radiation having a first spectrum when an electrical voltage is applied across said electrodes; and at least one organic photoluminescent ("PL") material disposed separately from said electroluminescent material in a path of light emitted by said light-emitting member, said organic PL material absorbing a portion of said first EM radiation and emitting second EM radiation having a second spectrum, said light-emitting device further comprising at least one inorganic PL material disposed adjacent to at least one of said organic EL material and said organic PL material, said inorganic PL material absorbing a portion of said first radiation and emitting third radiation having a third spectrum.

20. The light-emitting device according to claim 19, wherein light emitted from said light-emitting device has a correlated color temperature in a range from about 3000 K to about 6500 K.

21. The light-emitting device according to claim 19, wherein said third spectrum has wavelengths in a range from about 500 nm to about 770 nm.

22. The light-emitting device according to claim 19, wherein said organic PL material and said inorganic PL material are dispersed in separate layers of polymeric materials, said layers being disposed on said light-emitting member.

23. The light-emitting device according to claim 22, wherein said substrate and said polymeric materials have refractive indices from about 1.4 to about 1.6.

24. A light-emitting device comprising:
(1) light-emitting member that comprises a first electrode and a second electrode and at least one organic EL material disposed between said first and second electrodes, said light-emitting member being disposed on a substrate and emitting first EM radiation having a first spectrum when an electrical voltage is applied across said electrodes, said first spectrum having wavelengths in a range from about 300 nm to about 770 nm;
(2) at least one layer of at least one organic PL material disposed adjacent to said light-emitting member, said organic PL material absorbing a first portion of said first EM radiation and emitting second EM radiation having a second spectrum having wavelengths in a range from about 500 nm to about 770 nm;
(3) at least one layer of at least one inorganic PL material disposed adjacent to at least one of said organic EL material and said organic PL material, said inorganic PL material absorbing a second portion of said first EM radiation and emitting third EM radiation having a third spectrum having wavelengths in a range from about 500 nm to about 700 nm; and
(4) a layer comprising at least one light-scattering material disposed in a path of light emitted from said light-emitting member;
wherein light emitted from said light-emitting device has a correlated color temperature in a range from about 3000 K to about 6500 K.

25. The light-emitting device of claim 24, wherein each of said organic EL material, said at least one organic PL material, and said at least one inorganic PL material covers more than about 10 percent of a surface of said substrate and exhibits continuity to a naked eye.

26. The light-emitting device of claim 24, wherein each of said organic EL material, said at least one organic PL material, and said at least one inorganic PL material covers substantially an entire surface of said substrate and exhibits continuity to a naked eye.

27. A light-emitting device comprising:
   (1) a light-emitting member that comprises a first electrode and a second electrode and at least one organic EL material disposed between said first and second electrodes, said light-emitting member being disposed on a substrate and emitting first EM radiation having a first spectrum when an electrical voltage is applied across said electrodes;
   (2) at least one layer of at least one organic PL material disposed adjacent to said light-emitting member, said organic PL material absorbing a first portion of said first EM radiation and emitting second EM radiation having a second spectrum;
   (3) at least one layer containing an additional material selected from the group consisting of:
      (a) at least one inorganic PL material disposed adjacent to at least one of said organic EL material and said organic PL material, said inorganic PL material absorbing a second portion of said first EM radiation and emitting third EM radiation having a third spectrum;
      (b) at least one light-scattering material disposed in a path of light emitted from said light-emitting member; and
   (4) a substantially transparent encapsulant layer disposed around an assembly of (1), (2) and (3).

28. The light-emitting device according to claim 27, wherein said encapsulant is selected from the group consisting of silicone, epoxy, and silicone-functionalized epoxy.

29. A light-emitting device comprising:
   (1) a light-emitting member that comprises a first electrode and a second electrode and at least one organic EL material disposed between said first and second electrodes, said light-emitting member being disposed on a substrate and emitting first EM radiation having a first spectrum when an electrical voltage is applied across said electrodes, said first spectrum having wavelengths in a range from about 300 nm to about 770 nm;
   (2) at least one layer of at least one organic PL material disposed adjacent to said light-emitting member, said organic PL material absorbing a first portion of said first EM radiation and emitting second EM radiation having a second spectrum having wavelengths in a range from about 500 nm to about 770 nm;
   (3) at least one layer of at least one inorganic PL material disposed adjacent to at least one of said organic EL material and said organic PL material, said inorganic PL material absorbing a second portion of said first EM radiation and emitting third EM radiation having a third spectrum having wavelengths in a range from about 500 nm to about 770 nm; and
   (4) a layer containing at least one light-scattering material disposed in a path of light emitted from said light-emitting member;
wherein light emitted from said light-emitting device has a correlated color temperature in a range from about 3000 K to about 6500 K; each of said organic EL material, said at least one organic PL material, and said at least one inorganic PL material covers more than about 10 percent of a surface of said substrate and exhibits continuity to a naked eye; said first electrode comprises a material selected from the group consisting of K, Li, Na, Mg, La, Ce, Ca, Sr, Ba, Al, Ag, In, Sn, Zn, Zr, Sm, Eu, alloys thereof, and mixtures thereof; said at least one organic EL material is selected from the group consisting of poly(n-vinylcarbazole), poly(alkylfluorene), poly(paraphenylene), polysilanes, derivatives thereof, mixtures thereof, copolymers thereof, 1,3,5-tris{n-(4-diphenylaminophenyl)phenylamino}benzene, phenylanthracene, tetraarylethene, coumarin, rubrene, tetraphenylbutadiene, anthracene, perylene, coronene, aluminum-(picolymethylketone)-bis{2,6-di(t-butyl)phenoxide}, scandium-(4-methoxy-picolymethylketone)-bis(acetylacetonate), aluminum-acetylacetonate, gallium-acetylacetonate, and indium-acetylacetonate; said second electrode comprises a material elected from the group consisting of ITO, tin oxide, indium oxide, zinc oxide, indium zinc oxide, and mixtures thereof; said organic PL material is at least one material selected from the group consisting of perylenes, benzopyrenes, coumarin dyes, polymethine dyes, xanthene dyes, oxobenzanthracene dyes, perylenebis (dicarboximide), pyrans, thiopyrans, and azo dyes; said inorganic PL material is at least one material selected from the group consisting of $(Y_{1-x}Ce_x)_3Al_5O_{12}$; $(Y_{1-x-y}Gd_xCe_y)_3Al_5O_{12}$; $(Y_{1-x}Ce_x)_3(Al_{1-y}Ga_y)O_{12}$; $(Y_{1-x-y}Gd_xCe_y)(Al_{5-z}Ga_z)O_{12}$; $(Gd_{1-x}Ce_x)Sc_2Al_3O_{12}$; $Ca_8Mg(SiO_4)_4Cl_2:Eu^{2+},Mn^{2+}$; $GdBO_3:Ce^{3+}, Tb^{3+}$; $CeMgAl_{11}O_{19}:Tb^{3+}$; $Y_2SiO_5:Ce^{3+},Tb^{3+}$; $BaMg_2Al_{16}O_{27}:Eu^{2+},Mn^{2+}$; $Y_2O_3:Bi^{3+},Eu^{3+}$; $Sr_2P_2O_7:Eu^{2+},Mn_{2+}$; $SrMgP_2O_7:Eu^{2+},Mn^{2+}$; $(Y,Gd)(V,B)O_4:Eu^{3+}$; $3.5MgO.0.5MgF_2.GeO_2:Mn^{4+}$ (magnesium fluorogerminate); $BaMg_2Al_{16}O_{27}:Eu^{2+}$; $Sr_5(PO_4)_{10}Cl_2:Eu^{2+}$; $BaMg_2Al_{16}O_{27}:Eu^{2+}$; $Sr_5(PO_4)_{10}Cl_2:Eu^{2+}$; $(Ca,Ba,Sr)(Al,Ga)_2S_4:Eu^{2+}$; $(Ba,Ca,Sr)_5(PO_4)_{10}(Cl,F)_2:Eu^{2+},Mn^{2+}$; $Lu_3Al_5O_{12}:Ce^{3+}$; $Tb_3Al_5O_{12}:Ce^{3+}$; and mixtures thereof; wherein $0 \leq x \leq 1$, $0 \leq y \leq 1$, $0 \leq z \leq 5$ and $x+y \leq 1$; and said light-scattering material is selected from the group consisting of rutile ($TiO_2$), hafnia ($HfO_2$), zirconia($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$), calcite ($CaCO_3$), sapphire ($Al_2O_3$), diamond, magnesium oxide, germanium oxide.

30. A method of making a light-emitting device that is based on at least one organic EL material, said method comprising the steps of:
   (1) providing a substrate;
   (2) forming a light-emitting member in a process comprising the steps of:
      (a) depositing a first electrically conducting material on one surface of said substrate to form a first electrode;
      (b) depositing said at least one organic EL material on said first electrode; and
      (c) depositing a second electrically conducting material on said organic EL material to form a second electrode; and
   (3) disposing at least one organic PL material adjacent to said light-emitting member, said organic PL material being separate from said organic EL material.

31. The method according to claim 30, wherein said steps of depositing said first and second electrically conducting materials are selected from the group consisting of physical vapor deposition, chemical vapor deposition, and sputtering.

32. The method according to claim 30, wherein said step of depositing said at least one organic EL material is selected from the group consisting of physical vapor deposition, chemical vapor deposition, spin coating, dip coating, spraying, ink-jet printing, and casting.

33. The method according to claim 30, wherein said step of disposing at least one organic PL material comprises depositing said organic PL material by a method selected from the group consisting of physical vapor deposition, chemical vapor deposition, spin coating, dip coating, spraying, ink-jet printing, and casting.

34. The method according to claim 30, wherein said step of disposing at least one organic PL material comprises dispersing said organic PL material in a substantially transparent polymeric material to form a mixture, casting said mixture into a film by a doctor blade method, curing said film, and disposing said film adjacent to said light-emitting member.

35. The method according claim 30, wherein said step of forming said light-emitting member further comprises depositing at least one additional layer of an organic material between one of said electrodes and said organic EL material for a function selected from the group consisting of hole injection enhancement, hole transport, and electron injection enhancement and transport.

36. The method according to claim 30 further comprising the step of disposing at least one light-scattering material in a path of light emitted from at least one said light-emitting member and said organic PL material.

37. The method according to claim 36, wherein said step of disposing at least one light-scattering material comprises dispersing particles of said light-scattering material in a substantially transparent polymeric material to produce a mixture, forming a film of said mixture, and disposing said film adjacent to at least one of said organic EL material and said organic PL material.

38. A method of making a light-emitting device that is based on at least one organic EL material, said method comprising the steps of:
　(1) providing a substrate;
　(2) forming a light-emitting member in a process comprising the steps of:
　　(a) depositing a first electrically conducting material on one surface of said substrate to form a first electrode;
　　(b) depositing said at least one organic EL material on said first electrode; and
　　(c) depositing a second electrically conducting material on said organic EL material to form a second electrode; and
　(3) disposing at least one organic PL material adjacent to said light-emitting member;
said method further comprising the steps of disposing at least one inorganic PL material adjacent to said organic PL material.

39. The method according to claim 38, wherein said step of disposing at least one inorganic PL material comprises dispersing said inorganic PL material in a substantially transparent polymeric material to form a mixture and depositing said mixture on said organic PL material by a method selected from the group consisting of spin coating, dip coating, spraying, ink-jet printing, and casting.

40. The method according to claim 38, wherein said step of disposing at least one inorganic PL material comprises dispersing said inorganic PL material in a substantially transparent polymeric material to form a mixture and casting said mixture into a film using a doctor blade method, curing said film, and disposing said film adjacent to said organic PL material.

41. The method according to claim 38 further comprising the step of disposing at least one light-scattering material in a path of light emitted from at least one of said light-emitting member, said organic PL material, and said inorganic PL material.

42. The method according to claim 41, wherein said step of disposing at least one light-scattering material comprises dispersing particles of said light-scattering material in a substantially transparent polymeric material to produce a mixture, forming a film of said mixture, and disposing said film adjacent to at least one of said organic EL material, said organic PL material, and said inorganic PL material.

* * * * *

UNITED STATES PATENT AND TRADEMARK OFFICE
CERTIFICATE OF CORRECTION

PATENT NO. : 6,903,505 B2
DATED : June 7, 2005
INVENTOR(S) : McNulty et al.

It is certified that error appears in the above-identified patent and that said Letters Patent is hereby corrected as shown below:

Column 12,
Line 49, after "spectrum" insert -- , wherein said organic PL material is separted from said EL material by one of said electrodes --.

Column 16,
Line 53, cancel "separate" and insert -- separated --.
Line 53, after "material" insert -- by one of said electrodes --.

Signed and Sealed this

Sixth Day of September, 2005

JON W. DUDAS
*Director of the United States Patent and Trademark Office*